(12) United States Patent
Cui et al.

(10) Patent No.: US 9,761,769 B2
(45) Date of Patent: Sep. 12, 2017

(54) ASSEMBLY THAT EMITS ELECTROMAGNETIC RADIATION AND METHOD OF PRODUCING AN ASSEMBLY THAT EMITS ELECTROMAGNETIC RADIATION

(71) Applicant: OSRAM Opto Semiconductors GmbH, Regensburg (DE)

(72) Inventors: Hailing Cui, Regensburg (DE); Kathy Schmidtke, Mainburg (DE)

(73) Assignee: OSRAM Opto Semiconductors GmbH (DE)

( * ) Notice: Subject to any disclaimer, the term of this patent is extended or adjusted under 35 U.S.C. 154(b) by 31 days.

(21) Appl. No.: 14/782,092

(22) PCT Filed: Mar. 25, 2014

(86) PCT No.: PCT/EP2014/055952
§ 371 (c)(1),
(2) Date: Oct. 2, 2015

(87) PCT Pub. No.: WO2014/161748
PCT Pub. Date: Oct. 9, 2014

(65) Prior Publication Data
US 2016/0056349 A1   Feb. 25, 2016

(30) Foreign Application Priority Data

Apr. 5, 2013   (DE) .................. 10 2013 103 416

(51) Int. Cl.
*H01L 33/50* (2010.01)
*H01L 33/64* (2010.01)

(52) U.S. Cl.
CPC .......... *H01L 33/508* (2013.01); *H01L 33/507* (2013.01); *H01L 33/641* (2013.01);
(Continued)

(58) Field of Classification Search
CPC .......... H01L 33/507; H01L 2933/0041; H01L 2933/0091; H01L 33/502; H01L 33/508;
(Continued)

(56) References Cited

U.S. PATENT DOCUMENTS 6,747,293 B2 *  6/2004  Nitta ................... H01L 25/0753
                                              257/100
6,867,542 B1    3/2005  Sun et al.
(Continued)

FOREIGN PATENT DOCUMENTS

DE    10 2008 030 253 A1    12/2009
DE    10 2009 018 087 A1    12/2009
(Continued)

*Primary Examiner* — Bac Au
(74) *Attorney, Agent, or Firm* — DLA Piper LLP (US)

(57) ABSTRACT

An electromagnetic radiation emitting assembly includes a carrier, an electromagnetic radiation emitting component arranged above the carrier, and a potting material at least partly surrounding the electromagnetic radiation emitting component and into which are embedded phosphor that converts the electromagnetic radiation and heat-conducting particles that conduct heat arising during operation of the electromagnetic radiation emitting assembly, wherein a phosphor concentration in the potting material near the electromagnetic radiation emitting component is greater than a particle concentration of the heat-conducting particles in the potting material near the electromagnetic radiation emitting component, and a particle concentration of the heat-conducting particles in the potting material near the electromagnetic radiation emitting component is greater than in the potting material remote from the electromagnetic radiation emitting component.

14 Claims, 3 Drawing Sheets

(52) U.S. Cl.
CPC .... *H01L 33/644* (2013.01); *H01L 2924/0002* (2013.01); *H01L 2933/0041* (2013.01); *H01L 2933/0075* (2013.01)

(58) Field of Classification Search
CPC ............. H01L 33/504; H01L 31/02322; H01L 31/054; H01L 31/055; H01L 33/44; H01L 33/641; H01L 51/5012; H01L 2933/0075
See application file for complete search history.

(56) References Cited

U.S. PATENT DOCUMENTS

| | | | | |
|---|---|---|---|---|
| 6,960,878 | B2* | 11/2005 | Sakano | B29C 67/08 257/10 |
| 8,004,002 | B2* | 8/2011 | Okazaki | H01L 33/504 257/100 |
| 8,110,839 | B2* | 2/2012 | Ing | G02F 1/133606 257/89 |
| 8,288,936 | B2* | 10/2012 | Ohta | C09K 11/02 313/503 |
| 8,476,657 | B2* | 7/2013 | Kawasaki | H01L 25/167 257/100 |
| 8,598,618 | B2* | 12/2013 | Ishii | C09K 11/7734 257/100 |
| 8,735,926 | B2* | 5/2014 | Sakai | H01L 33/005 257/98 |
| 9,287,469 | B2* | 3/2016 | Chakraborty | H01L 33/501 |
| 2006/0063289 | A1* | 3/2006 | Negley | H01L 33/501 438/26 |
| 2008/0308825 | A1* | 12/2008 | Chakraborty | H01L 33/56 257/98 |
| 2009/0050911 | A1* | 2/2009 | Chakraborty | H01L 33/56 257/89 |
| 2009/0256166 | A1* | 10/2009 | Koike | H01L 33/501 257/98 |
| 2009/0262516 | A1* | 10/2009 | Li | H01L 33/56 362/84 |
| 2010/0193806 | A1* | 8/2010 | Byun | H01L 33/507 257/88 |
| 2011/0001148 | A1* | 1/2011 | Sun | H01L 33/60 257/88 |
| 2011/0001151 | A1* | 1/2011 | Le Toquin | H01L 33/44 257/98 |
| 2011/0069490 | A1 | 3/2011 | Liu | |
| 2011/0147778 | A1 | 6/2011 | Ichikawa | |
| 2012/0153345 | A1 | 6/2012 | Ozaki et al. | |
| 2012/0235190 | A1* | 9/2012 | Keller | H01L 33/56 257/98 |
| 2013/0043431 | A1* | 2/2013 | Lin | C09K 11/02 252/301.36 |
| 2013/0076230 | A1 | 3/2013 | Watanabe et al. | |
| 2013/0267051 | A1 | 10/2013 | Petersen | |

FOREIGN PATENT DOCUMENTS

| | | |
|---|---|---|
| EP | 2 336 230 A1 | 6/2011 |
| JP | 2012-193283 A | 10/2012 |
| WO | 2008/043519 A1 | 4/2008 |
| WO | 2012/080263 A1 | 6/2012 |

\* cited by examiner

ASSEMBLY THAT EMITS ELECTROMAGNETIC RADIATION AND METHOD OF PRODUCING AN ASSEMBLY THAT EMITS ELECTROMAGNETIC RADIATION

TECHNICAL FIELD

This disclosure relates to an electromagnetic radiation emitting assembly and to a method of producing an electromagnetic radiation emitting assembly.

BACKGROUND

Energy-efficient and high-intensity light sources such as LEDs (light emitting diodes) or lasers, usually in the form of laser diodes, are increasingly being used nowadays in modern lighting devices. Unlike incandescent bulbs, which are thermal emitters, such light sources emit light in a narrowly delimited spectral range such that their light is almost monochromatic or exactly monochromatic. One possibility for opening up further spectral ranges consists of light conversion, for example, wherein phosphors are irradiated by LEDs and/or laser diodes and for their part emit light having a different wavelength. By way of example, a layer comprising phosphor can be illuminated by LEDs or laser diodes and for its part emits light having a different color, i.e. a different wavelength. By way of example, this technique can be used to convert light of blue LEDs into white light by admixing yellow light generated by excitation of a phosphor-containing layer.

As conversion layers, thin phosphor layers such as silicate minerals, orthosilicates, garnets or nitrides are applied to surfaces of corresponding carriers. In that case, the phosphor layers are usually mechanically fixed with binders and linked to an optical system (lenses, collimators, etc.), wherein light coupling can be effected via air or by an immersion medium, for example. To ensure that the optical system is optically linked to the phosphor as optimally as possible and to avoid light losses, as direct an optical linking as possible should be ensured.

In the applications mentioned above, the phosphors are usually excited to emission by LEDs and/or laser diodes having high light powers. Thermal losses that arise have to be dissipated, for example, via the carrier to avoid overheating and thus thermally governed changes in the optical properties or even destruction of the phosphor.

Without an additional use of binders, for example, silicones, the phosphors usually present in pulverulent form do not form mechanically stable layers, i.e. abrasion- and/or scratch-resistant layers. However, binders are also generally used to combine the phosphor particles into one phase which can then be applied to corresponding surfaces. With the use of binders for layer stabilization, however, those binders can interact with the phosphors and thus adversely influence their optical and thermal properties, and also their lifetime. Furthermore, thermal conductivity of the binders often constitutes a limiting variable in dissipation of heat that arises in the converter element.

As alternatives, converter elements are known which are formed from a ceramic comprising the phosphor or from a crystal comprising the phosphor. In particular, the phosphor can form the ceramic or the crystal. Such converter elements can be fixedly adhesively bonded to LEDs such that the heat that arises therein can be dissipated. In that case, a limiting variable for the heat dissipation is the thermal conductivity of the adhesive used. Furthermore, it is beneficial to good heat dissipation if the converter elements are made particularly thin. However, a limiting variable for the thickness of the converter element is the stability of the converter element, the stability diminishing with diminishing thickness, and the required handlability when applying the converter element to the heat sink. In very thin converter elements, this can lead to a high level of rejects in the production process. The phosphor used is embedded in the ceramic or incorporated in the crystal structure and, in various examples, can be a phosphor mixture comprising a mixture of different phosphors as a result of which light which combines a plurality of different colors can be generated, for example. The converter element can consist, for example, completely or only partly of crystal or ceramic. Independently thereof, the converter element can comprise a matrix material which can comprise diamond or $Al_2O_3$, for example.

Furthermore, in electromagnetic radiation emitting assemblies, which hereinafter are also designated as assemblies for short, electromagnetic radiation emitting components which hereinafter are also designed as components for short, are embedded into a potting material comprising the phosphor or phosphors. In other words, the phosphors are embedded into the potting material in these assemblies. The heat that arises during the light conversion then has to be dissipated via the potting material.

Important parameters of the LEDs are the lifetime and brightnesses thereof. To attain high brightness values, the LEDs are regularly operated with relatively high energies which can lead to a high operating temperature since, during the conversion process, much unused energy is converted into heat. As the operating temperature increases, however, the lifetime decreases since the corresponding assembly becomes more susceptible to cracks and/or can age more rapidly. To ensure good and rapid heat dissipation, conversion layers are arranged in part near the corresponding components such that the heat that arises in the conversion layers can be rapidly dissipated via the corresponding component. The conversion layers near the components, for example, high-power LEDs, can be formed, for example, by EPD (electrophoretic deposition), spray coating and/or layer transfer, for example, the transfer of ceramic or silicone laminae or layers.

SUMMARY

We provide an electromagnetic radiation emitting assembly including a carrier, an electromagnetic radiation emitting component arranged above the carrier, and a potting material at least partly surrounding the electromagnetic radiation emitting component and into which are embedded phosphor that converts the electromagnetic radiation and heat-conducting particles that conduct heat arising during operation of the electromagnetic radiation emitting assembly, wherein a phosphor concentration in the potting material near the electromagnetic radiation emitting component is greater than a particle concentration of the heat-conducting particles in the potting material near the electromagnetic radiation emitting component, and a particle concentration of the heat-conducting particles in the potting material near the electromagnetic radiation emitting component is greater than in the potting material remote from the electromagnetic radiation emitting component.

We further provide an electromagnetic radiation emitting assembly including a carrier, an electromagnetic radiation emitting component arranged above the carrier, and a potting material at least partly surrounding the electromagnetic radiation emitting component and into which are embedded phosphor that converts the electromagnetic radiation and heat-conducting particles that conduct heat arising during operation of the electromagnetic radiation emitting assembly, wherein a phosphor concentration in the potting material near the electromagnetic radiation emitting component is greater than a particle concentration of the heat-conducting particles in the potting material near the electromagnetic radiation emitting component, and the phosphor concentration in the potting material remote from the electromagnetic radiation emitting component is greater than the particle concentration of the heat-conducting particles in the potting material remote from the electromagnetic radiation emitting component.

We yet further provide a method of producing an electromagnetic radiation emitting assembly including arranging an electromagnetic radiation emitting component above a carrier, and arranging a potting material above the electromagnetic radiation emitting component such that the potting material at least partly surrounds the electromagnetic radiation emitting component, wherein phosphor that converts the electromagnetic radiation and heat-conducting particles that conduct heat arising during operation of the electromagnetic radiation emitting assembly are embedded in the potting material, the potting material, the phosphor particles and the heat-conducting particles are formed, and process parameters are predefined such that the phosphor particles and the heat-conducting particles sediment in the potting material and the phosphor concentration in the potting material near the electromagnetic radiation emitting component becomes greater than the particle concentration of the heat-conducting particles in the potting material near the electromagnetic radiation emitting component and a particle concentration of the heat-conducting particles in the potting material near the electromagnetic radiation emitting component becomes greater than in the potting material remote from the electromagnetic radiation emitting component.

We still further provide a method of producing an electromagnetic radiation emitting assembly including arranging an electromagnetic radiation emitting component above a carrier, and arranging a potting material above the electromagnetic radiation emitting component such that the potting material at least partly surrounds the electromagnetic radiation emitting component, wherein phosphor that converts the electromagnetic radiation and heat-conducting particles that conduct heat arising during operation of the electromagnetic radiation emitting assembly are embedded in the potting material, the potting material, the phosphor particles and the heat-conducting particles are formed, and process parameters are predefined such that the phosphor particles and the heat-conducting particles sediment in the potting material and the phosphor concentration in the potting material near the electromagnetic radiation emitting component becomes greater than the particle concentration of the heat-conducting particles in the potting material near the electromagnetic radiation emitting component and the phosphor concentration in the potting material remote from the electromagnetic radiation emitting component becomes greater than the particle concentration of the heat-conducting particles in the potting material remote from the electromagnetic radiation emitting component.

DETAILED DESCRIPTION

Figure 1:
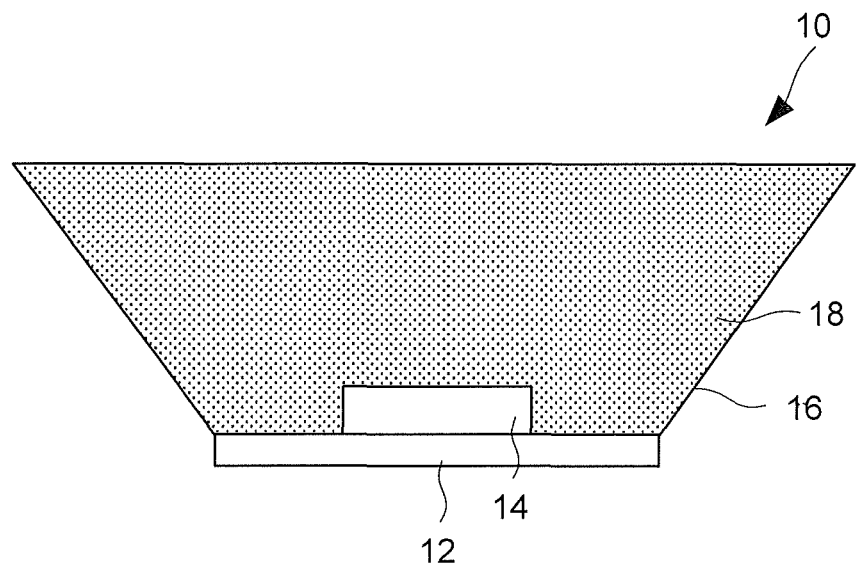
FIG. 1 shows one example of an electromagnetic radiation emitting assembly.

We provide an electromagnetic radiation emitting assembly which can be operated with a high power, in which heat that arises during operation can be dissipated effectively and/or which has a long lifetime.

We also provide a method of producing an electromagnetic radiation emitting assembly which, in a simple and expedient manner, makes it possible that the assembly can be operated with a high power, that heat that arises during operation of the assembly can be dissipated effectively and/or that the assembly has a long lifetime.

An electromagnetic radiation emitting assembly comprises a carrier. An electromagnetic radiation emitting component is arranged above the carrier. The electromagnetic radiation emitting component is at least partly surrounded by a potting material into which are embedded phosphor that converts the electromagnetic radiation and heat-conducting particles that conduct heat that arises during operation of the electromagnetic radiation emitting assembly.

The heat-conducting particles are particles having a high thermal conductivity. The potting material comprises a carrier material which can be formed as matrix polymer and/or can comprise, for example, silicone or resin, for example, epoxy resin. The heat-conducting particles and the phosphor, which can be present in the form of converter particles, for example, are embedded into the carrier material. The heat-conducting particles can comprise or be formed from an inorganic material, for example. The heat-conducting particles have a higher thermal conductivity than the carrier material. As a result, the thermal loading on the carrier material, for example, the matrix polymer, is relieved. In silicone, the carrier material can have a thermal conductivity of 0.2 W/mK, for example. Thermal conductivity of the heat-conducting particles can then be greater than 0.2 W/mK and be, for example, 1.4 W/mK to 9 W/mK, wherein the potting material comprising the phosphor and the heat-conducting particles can have, for example, a thermal conductivity of approximately 0.5 W/mK or more.

The assembly can comprise a housing, for example, in which the carrier and/or the component are/is arranged and in which the potting material is potted. The housing with the carrier, the component and the potting material can also be referred to as an LED package. A refractive index of the heat-conducting particles can be matched to the carrier material to keep the scattering losses as low as possible.

Use of the heat-conducting particles in combination with the phosphor in the potting material contributes to particularly good heat conduction in the assembly and, during operation of the assembly, can contribute to a rapid and/or particularly good heat distribution in the potting material and/or the assembly and/or heat dissipation. In particular, the assembly has a high effectiveness in heat dissipation. This makes it possible for the assembly to be operated with a particularly high power. Furthermore, this can contribute to the assembly having a particularly long lifetime.

The fact that the electromagnetic radiation emitting component is at least partly surrounded by the potting material can mean, for example, that the component has a first side facing away from the carrier, a second side facing the carrier and side walls connecting the first and second sides, and the potting material adjoins the first side and/or at least one side wall, for example, all the side walls of the component.

A phosphor concentration of the phosphor in the potting material near the electromagnetic radiation emitting component may be greater than in the potting material remote from the electromagnetic radiation emitting component. In other words, the phosphor forms a near-chip conversion layer. This contributes to the fact that the conversion of the electromagnetic radiation, which hereinafter is also designated as radiation for short, takes place near the component, and that the heat that arises in this case can be dissipated rapidly and effectively via the component, the carrier and/or the housing. The phosphor layer near the component can be obtained, for example, by sedimentation of the phosphor in the potting material. The phosphor concentration denotes the particle concentration of the particles which comprise the phosphor, for example, of the phosphor particles.

A particle concentration of the heat-conducting particles in the potting material near the electromagnetic radiation emitting component may be greater than in the potting material remote from the electromagnetic radiation emitting component. In other words, the heat-conducting particles form a near-chip heat-conducting particle layer. This contributes to the fact that the heat that arises during operation can be emitted rapidly and/or effectively to the component, the housing and/or the carrier and be dissipated via the component, the housing and/or the carrier. The heat-conducting particle layer near the component can be obtained, for example, by sedimentation of the heat-conducting particles in the potting material.

Furthermore, the phosphor concentration and the particle concentration of the heat-conducting particles in the potting material near the electromagnetic radiation emitting component can be greater than in the potting material remote from the electromagnetic radiation emitting component. In other words, the phosphors and the heat-conducting particles can form a near-chip combination layer. This can contribute, for example, to the fact that the heat that arises during operation can be emitted particularly rapidly and effectively to the component, the carrier and/or the housing and be dissipated via the component, the carrier and/or the housing, as a result of which the component can be operated with a higher power and/or has a longer lifetime. The combination layer can be obtained, for example, by simultaneous sedimentation of the particles comprising phosphor and of the heat-conducting particles in the potting material.

The phosphor concentration in the potting material near the electromagnetic radiation emitting component may be greater than the particle concentration of the heat-conducting particles in the potting material near the electromagnetic radiation emitting component. By way of example, the phosphor layer can be formed after the component and the heat-conducting particle layer can be formed behind that, as viewed from the component. This can contribute to the fact that the conversion of the radiation takes place near the component and the heat near the component can be dissipated rapidly and effectively into the component and otherwise, too, the heat can be well distributed in the potting material and/or dissipated via the housing. Optionally, potting material comprising a very small proportion of phosphor particles and/or heat-conducting particles can be formed behind the heat-conducting particle layer, as viewed from the component.

The phosphor concentration in the potting material near the electromagnetic radiation emitting component may be less than the particle concentration of the heat-conducting particles in the potting material near the electromagnetic radiation emitting component. By way of example, the heat-conducting particle layer can be formed after the component and the phosphor layer can be formed behind that as viewed from the component. This can contribute to the fact that the heat can be guided from the phosphor layer to the component rapidly and effectively. Optionally, potting material having a very small proportion of phosphor particles and/or heat-conducting particles can be formed behind the heat-conducting particle layer as viewed from the component.

The phosphor concentration in the potting material remote from the electromagnetic radiation emitting component may be greater than the particle concentration of the heat-conducting particles in the potting material remote from the electromagnetic radiation emitting component. By way of example, in the potting material as viewed from the component behind the phosphor layer, the heat-conducting particle layer and/or the combination layer, it is possible to form a region in the potting material having a small proportion of phosphor particles, which proportion is greater, however, than the proportion of heat-conducting particles in the same region.

The heat-conducting particles may have a thermal conductivity of 1 W/mK to 9 W/mK. This makes it possible that the heat that arises during operation of the assembly can be dissipated and/or distributed particularly well with the aid of the heat-conducting particles.

The heat-conducting particles may comprise $SiO_2$ and/or cristobalite.

A method of producing an electromagnetic radiation emitting assembly, for example, the assembly explained above, is provided wherein the electromagnetic radiation emitting component is arranged above the carrier in the housing. The potting material is arranged above the electromagnetic radiation emitting component. The potting material is arranged such that it at least partly surrounds the electromagnetic radiation emitting component. The potting material comprises phosphor that converts the electromagnetic radiation and heat-conducting particles that conduct heat that arises during operation of the electromagnetic radiation emitting assembly.

The potting material and the phosphor particles may be formed, and process parameters may be predefined such that the phosphors sediment in the potting material such that a phosphor concentration of the phosphor in the potting material near the electromagnetic radiation emitting component becomes greater than in the potting material remote from the electromagnetic radiation emitting component. The fact that the process parameters are predefined can mean, for example, that the process parameters are set in this way and/or that the method is carried out for the predefined process parameters. The process parameters can comprise, for example, a temperature of the surroundings and/or of the potting material, a viscosity of the carrier material, a density of the carrier material and/or a particle size of the particles comprising the phosphor and/or of the heat-conducting particles.

The potting material and the heat-conducting particles may be formed, and the process parameters predefined such that the heat-conducting particles sediment in the potting material and the particle concentration of the heat-conducting particles in the potting material near the electromagnetic radiation emitting component becomes greater than in the potting material remote from the electromagnetic radiation emitting component.

The potting material, the phosphor particles and the heat-conducting particles may be formed, and the process parameters predefined such that the phosphor particles and the heat-conducting particles sediment in the potting material and the phosphor concentration in the potting material near the electromagnetic radiation emitting component becomes greater than the particle concentration of the heat-conducting particles in the potting material near the electromagnetic radiation emitting component.

The potting material, the phosphor particles and the heat-conducting particles may be formed and the process parameters predefined such that the phosphor particles and the heat-conducting particles sediment in the potting material and the phosphor concentration in the potting material near the electromagnetic radiation emitting component becomes less than the particle concentration of the heat-conducting particles in the potting material near the electromagnetic radiation emitting component.

The potting material, the phosphor particles and the heat-conducting particles may be formed and the process parameters predefined such that the phosphor particles and the heat-conducting particles sediment in the potting material and the phosphor concentration in the potting material remote from the electromagnetic radiation emitting component becomes greater than the particle concentration of the heat-conducting particles in the potting material remote from the electromagnetic radiation emitting component.

Particles having a thermal conductivity of 1 W/mK to 9 W/mK may be used as heat-conducting particles, for example, $SiO_2$ or cristobalite.

Examples are illustrated in the figures and are explained in greater detail below.

In the following detailed description, reference is made to the accompanying drawings, which form part of this description and show for illustration purposes specific examples in which our methods and assemblies can be implemented. In this regard, direction terminology such as, for instance, "at the top", "at the bottom", "at the front", "at the back", "front", "rear" and the like is used with respect to the orientation of the figure(s) described. Since component parts of examples can be positioned in a number of different orientations, the direction terminology serves for illustration and is not restrictive in any way whatsoever. Other examples can be used and structural or logical changes can be made, without departing from the scope of protection of this disclosure. The features of the various examples described herein can be combined with one another, unless specifically indicated otherwise. Therefore, the following detailed description should not be interpreted in a restrictive sense, and the scope of protection is defined by the appended claims.

The terms "connected" and "coupled" are used to describe both a direct and an indirect connection and a direct or indirect coupling. In the figures, identical or similar elements are provided with identical reference signs, insofar as this is expedient.

An electromagnetic radiation emitting assembly can comprise an electromagnetic radiation emitting component and one, two or more optically functional bodies, materials and/or a housing. An optically functional body or an optically functional material can influence and/or guide or pass electromagnetic radiation. Influencing the electromagnetic radiation can comprise scattering and/or conversion of the electromagnetic radiation, for example. An electromagnetic radiation emitting component can, for example, be an electromagnetic radiation emitting semiconductor component and/or be formed as an electromagnetic radiation emitting diode, as an organic electromagnetic radiation emitting diode, as an electromagnetic radiation emitting transistor or as an organic electromagnetic radiation emitting transistor. The radiation can be light in the visible range, UV light and/or infrared light, for example. The electromagnetic radiation emitting component can be formed, for example, as a light emitting diode (LED), as an organic light emitting diode (OLED), as a light emitting transistor or as an organic light emitting transistor. In various examples, the light emitting component can be part of an integrated circuit. Furthermore, a plurality of light emitting components can be provided in an electromagnetic radiation emitting assembly, for example, in a manner accommodated in a common housing.

The electromagnetic radiation emitting assembly hereinafter is also designated as assembly for short. The electromagnetic radiation emitting component hereinafter is also designated as component for short. The electromagnetic radiation hereinafter is also designated as radiation for short.

The term "translucent" or "translucent layer" can be understood to mean that a layer is transmissive to light, for example, to light generated by the light emitting component, for example, in one or more wavelength ranges, for example, to light in a wavelength range of visible light (for example, at least in a partial range of the wavelength range of 380 nm to 780 nm). By way of example, the term "translucent layer" should be understood to mean that substantially the entire quantity of light coupled into a structure (for example, a layer) is also coupled out of the structure (for example, layer), wherein a portion of the light can be scattered in the process.

The term "transparent" or "transparent layer" can be understood to mean that a layer is transmissive to light (for example, at least in a partial range of the wavelength range of 380 nm to 780 nm), wherein light coupled into a structure (for example, a layer) is also coupled out from the structure (for example, layer) substantially without scattering or light conversion.

FIG. 1 shows one example of an electromagnetic radiation emitting assembly 10. The assembly 10 comprises a carrier 12, an electromagnetic radiation emitting component 14, a housing 16 and potting material 18. The component 14 is arranged above the carrier 12. The component 14 has a first side facing away from the carrier 12, a second side facing the carrier 12, and side walls connecting the first side to the second side. The component 14 is formed, for example, as a surface emitter or as a volume emitter. The surface emitter emits the radiation at one of its sides, for example, at the first side. The volume emitter emits the radiation not only at the first side but also at the side walls of the volume emitter. In other words, the component 14 can emit the radiation in a direction perpendicular to the surface of the carrier 12 and perpendicular to said direction, that is to say in a lateral direction. In this application, the lateral direction denotes a direction that is parallel to a surface of the carrier 12 on which the component 14 is arranged. The volume emitter can be a chip, for example, which is based on a sapphire substrate. The carrier 12 can comprise, for example, ceramic, metal, plastic, a semiconductor material and/or resin, for example, epoxy resin. The carrier 12 can be, for example, a leadframe, a printed circuit board and/or a substrate.

The component 14 is embedded into the potting material 18 such that the first side of the component 14 and the side walls of the component 14 are in direct physical contact with the potting material 18. In other words, the potting material 18 adjoins the side walls and the first side of the component 14. The potting material 18 can be designated as an optically functional material. The potting material 18 comprises phosphor that converts radiation generated by the component 14. The potting material 18 comprises a carrier material which can comprise, for example, silicone or resin, for example, epoxy resin and the phosphor, which can be present, for example, in the form of particles comprising the phosphor, for example, in the form of phosphor particles. The carrier material can be formed in a transparent or translucent fashion.

Customary phosphors are, for example, garnets or nitrides silicates, nitrides, oxides, phosphates, borates, oxynitrides, sulfides, selenides, aluminates, tungstates, and halides of aluminum, silicon, magnesium, calcium, barium, strontium, zinc, cadmium, manganese, indium, tungsten and other transition metals, or rare earth metals such as yttrium, gadolinium or lanthanum which are doped with an activator such as, for example, copper, silver, aluminum, manganese, zinc, tin, lead, cerium, terbium, titanium, antimony or europium. In various examples, the phosphor is an oxidic or (oxy)nitridic phosphor such as a garnet, orthosilicate, nitrido (alumo)silicate, nitride or nitridoorthosilicate, or a halide or halophosphate. Specific examples of suitable phosphors are strontium chloroapatite:Eu(($Sr,Ca)5(PO4)3Cl:Eu$; SCAP), yttrium aluminum garnet:cerium (YAG:Ce) or $CaAlSiN3$:Eu. Furthermore, the phosphor or phosphor mixture can contain, for example, particles having light scattering properties and/or auxiliaries. Examples of auxiliaries include surfactants and organic solvents. Examples of light scattering particles are gold, silver and metal oxide particles.

In addition to the phosphor or the phosphor particles, the potting material 18 comprises heat-conducting particles. The heat-conducting particles have a high thermal conductivity. The thermal conductivity of the heat-conducting particles is higher than the thermal conductivity of the carrier material of the potting material 18. By way of example, the thermal conductivity of the carrier material with the use of silicone as carrier material is approximately 0.2 W/mK and the thermal conductivity of the heat-conducting particles is greater than 0.2 W/mK. By way of example, the thermal conductivity of the heat-conducting particles is 0.2 W/mK to 10 W/mK, for example, 1.4 W/mK, for example, with the use of $SiO_2$ particles as heat-conducting particles, to 9 W/mK, for example, with the use of cristobalite particles as heat-conducting particles. A total thermal conductivity of the potting material 18 can be, for example, 0.2 W/mK to 1 W/mK, for example, approximately 0.5 W/mK. An average diameter of the heat-conducting particles can be, for example, 1 µm to 10 µm, for example, 4 µm to 7 µm. A proportion by weight of the heat-conducting particles in the carrier material can be, for example, 1% to 30%, for example, 2% to 20%.

The phosphors are energetically excited with the aid of the radiation generated by the component 14, which radiation can also be designated as excitation radiation in this context. Upon the subsequent energetic deexcitation, the phosphors emit light of one or a plurality of predefined colors. Consequently, a conversion of the excitation radiation takes place, as a result of which the conversion radiation is generated. During the conversion, the wavelengths of the excitation radiation are shifted to shorter or longer wavelengths. The colors can be individual colors or mixed colors. The individual colors can comprise green, red or yellow light, for example, and/or the mixed colors can be mixed from green, red and/or yellow light, for example, and/or comprise white light, for example. In addition, blue light can be provided, for example, by the potting material 18 being formed such that at least partly non-converted excitation radiation leaves the assembly 10 as usable illumination light. By way of example, green, red and yellow can be represented with the aid of blue light. With the use of UV light as excitation radiation, the phosphors can also be chosen such that they represent red, green, blue and yellow.

During conversion of the radiation, heat arises, which can be distributed via the heat-conducting particles in the potting material and/or be dissipated via the potting material. The heat can be guided with the aid of the heat-conducting particles, for example, toward the housing 16, the carrier 12 and/or toward the component 14 and can be emitted via the housing 16, the carrier 12 and/or the component 14 and/or directly to the surroundings.

A reflector body can be formed on an inner side of the housing 16 and/or a side of the carrier 12 which adjoin the potting material 18. The reflector body can surround the potting material 24 in a lateral direction. The reflector body can be formed by a reflective layer, for example. The reflector body can comprise silicone, for example, into which reflective particles, for example, $TiO_2$ are embedded.

The component 14 comprises electrical connections (not illustrated) to electrically contact the component 14. By way of example, the component 14 can have on the first side of the component 14 two electrical connections electrically contacted with the aid of bond wires (not illustrated) with electrical contact faces (not illustrated) corresponding thereto on the carrier 12. As an alternative thereto, the component 14 can comprise on its side walls and/or its second side, one, two or more electrical connections which can be contacted with corresponding electrical contacts on the carrier 12.

When producing the assembly 10, first, the carrier 12 can be provided, for example, formed. The component 14 and, if appropriate, the mirror layer 16 can be formed on the carrier 12. For example, the component 14 can be arranged and/or fixed on the carrier 12 by an adhesion medium, for example, a solder or an adhesive. Afterward, the component 14 can be electrically contacted. As an alternative thereto, the arranging and the electrical contacting of the component 14 can be carried out simultaneously, for example, if the component 14 has its electrical connections on the side walls and/or the second side.

The potting material 18 can be applied to the component 14 within the housing 16, for example, in a viscous or liquid state. The phosphors and the heat-conducting particles can be mixed, for example, mixed homogeneously, in the carrier material. Afterward, the potting material 18 can be completely or at least partly solidified, for example, dried and/or cured. The potting material 18 can be formed, for example, such that, if appropriate, bond wires and/or electrical contacts of the carrier 12 are completely or partly surrounded in by the potting material 18 and/or are embedded into the potting material 18. The potting material 18 can be introduced into the housing, for example, by printing, spraying, dropwise application and/or dispensing.

Figure 2:
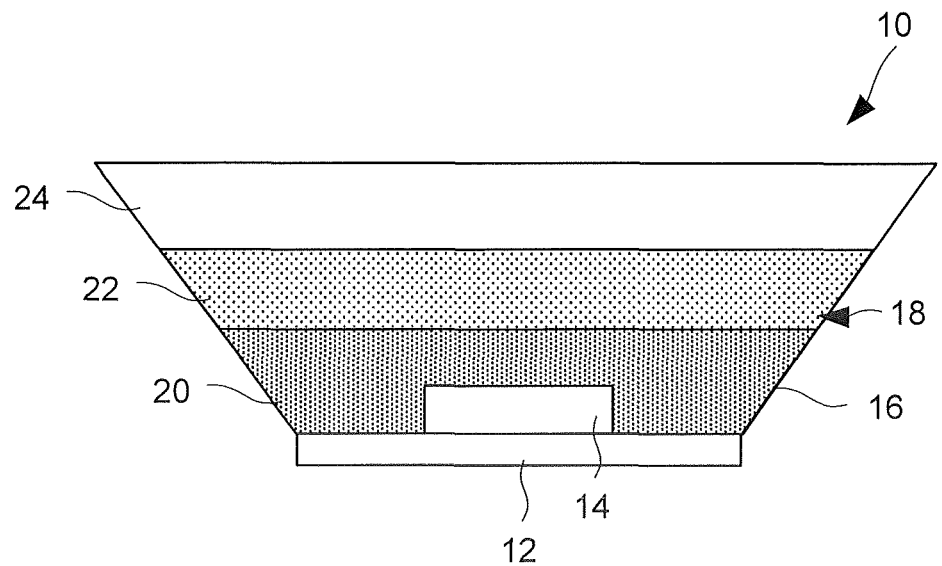
FIG. 2 shows one example of an electromagnetic radiation emitting assembly.

FIG. 2 shows one example of an assembly 10 which, for example, can largely correspond to the assembly 10 explained above. The potting material 18 has a phosphor region 20, a heat-conducting particle region 22 and a carrier material region 24. In the phosphor region 20, the phosphor concentration, for example, the particle concentration of the particles comprising the phosphor, is significantly greater than outside the phosphor region 20. The phosphor region 20 can also contain heat-conducting particles, but with a low heat-conducting particle concentration. By way of example, the heat-conducting particle concentration in the phosphor region 20 is significantly lower than the phosphor concentration in the phosphor region 20. In the heat-conducting particle region 22, the heat-conducting particle concentration, for example, the particle concentration of the heat-conducting particles, is significantly greater than outside the heat-conducting particle region 22. The heat-conducting particle region 22 can also contain phosphor, but with a low phosphor concentration. By way of example, the phosphor concentration in the heat-conducting particle region 22 is significantly lower than the heat-conducting particle concentration in the heat-conducting particle region 22. In the carrier material region 24, the phosphor concentration and the heat-conducting particle density are particularly low, for example, zero or approximately zero. The carrier material region 24 can be formed in a transparent or translucent fashion. Furthermore, the phosphor region 20 and the heat-conducting particle region 22 can comprise carrier material. In other words, the phosphors in the phosphor region 22 can be embedded into the carrier material and the heat-conducting particles in the heat-conducting particle region 22 can be embedded into the carrier material. The phosphor region 20 can also be designated as a phosphor layer. The heat-conducting particle region 22 can also be designated as a heat-conducting particle layer.

The phosphor region 20 is formed near the component 14, for example, in a manner directly adjoining the component 14. By way of example, the component 14 is embedded into the phosphor layer. As viewed from the component 14, the heat-conducting particle region 22 is formed behind the phosphor region 20, for example, in a manner directly adjoining the phosphor region 20. As viewed from the component 14, the carrier material region 24 is formed behind the heat-conducting particle region 22, for example, in a manner directly adjoining the heat-conducting particle region 22.

The phosphor region 20 and/or the heat-conducting particle region 22 can be formed, for example, by sedimentation of the phosphor particles and/or of the heat-conducting particles in the carrier material. By way of example, the phosphor particles and the heat-conducting particles can first be mixed, for example, homogeneously in the carrier material. The potting material 18 comprising the carrier material, the phosphors and the heat-conducting particles can then be filled to the housing 16 and onto the component 14, for example, by dispensing. In this case, the process parameters are predefined such that the phosphor particles and the heat-conducting particles sediment in the carrier material and form the phosphor layer and the heat-conducting particle layer, respectively. In particular, the process parameters are predefined such that the phosphors sediment first, the most rapidly and/or to the greatest extent, and in particular before the heat-conducting particles and/or more rapidly and/or to a greater extent than the heat-conducting particles. Moreover, the process parameters are predefined such that the heat-conducting particles also sediment in the carrier material.

The process parameters can be, for example, the carrier material itself, that is to say, for example, the type of carrier material, a viscosity of the carrier material, a temperature of the carrier material, a process duration and/or an ambient temperature. By way of example, the sedimentation can take place at an ambient temperature of 27° C. to 80° C., for example, 35° C. to 60° C. The temperature regulation can be carried out, for example, by heating the component 14, for example, in a process furnace. Furthermore, the sedimentation can take place, for example, during a time duration of 1 to 10 hours, for example, 3 to 6 hours. Alternatively or additionally, the sedimentation can be constrained and/or accelerated by centrifuging, wherein a rotational speed, for example, can then be one of the process parameters.

A phosphor concentration of the phosphor in the potting material 18 near the electromagnetic radiation emitting component 14, for example, in the phosphor region 20, is greater than in the potting material 18 remote from the electromagnetic radiation emitting component 14, for example, in the heat-conducting particle region 22 and/or the carrier material region 24.

A particle concentration of the heat-conducting particles in the potting material 18 near the electromagnetic radiation emitting component 14, for example, in the heat-conducting particle region 22, is greater than in the potting material 18 remote from the electromagnetic radiation emitting component 14, for example, in the carrier material region 24.

The phosphor concentration in the potting material 18 near the electromagnetic radiation emitting component 14, for example, in the phosphor region 20, is greater than the particle concentration of the heat-conducting particles in the potting material 18 near the electromagnetic radiation emitting component 14, for example, in the phosphor region 20.

Figure 3:
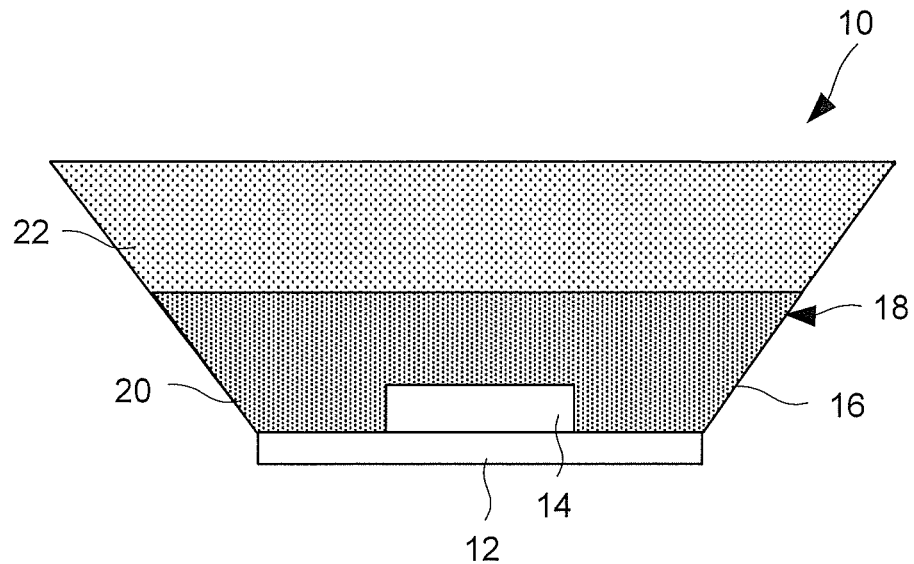
FIG. 3 shows one example of an electromagnetic radiation emitting assembly.

FIG. 3 shows one example of an assembly 10 which, for example, can largely correspond to one of the assemblies 10 explained above. The assembly 10 comprises the phosphor region 20 and the heat-conducting particle region 22, but no carrier material region 24.

The phosphor region 20 and the heat-conducting particle region 22 can be formed, for example, by the method explained above, in particular the sedimentation method. In this case, the process parameters are predefined such that, for example, only the phosphor particles sediment in the carrier material and form the phosphor layer. In the rest of the carrier material, the relative heat-conducting particle concentration increases as a result, whereby the heat-conducting particle layer is formed. In particular, the process parameters can be predefined such that the phosphors sediment and the heat-conducting particles do not sediment.

The phosphor concentration of the phosphor in the potting material 18 near the electromagnetic radiation emitting component 14, for example, in the phosphor region 20, is greater than in the potting material 18 remote from the electromagnetic radiation emitting component 14, for example, in the heat-conducting particle region 22.

The phosphor concentration in the potting material 18 near the electromagnetic radiation emitting component 14, for example, in the phosphor region 20, is greater than the particle concentration of the heat-conducting particles in the potting material 18 near the electromagnetic radiation emitting component 14, for example, in the phosphor region 20.

Figure 4:
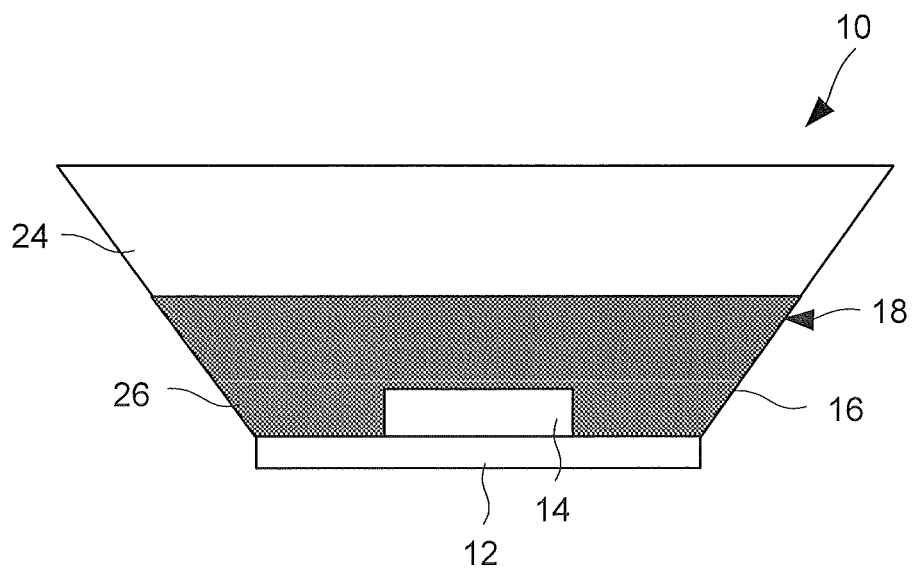
FIG. 4 shows one example of an electromagnetic radiation emitting assembly.

FIG. 4 shows one example of an assembly 10 which, for example, can largely correspond to one of the assemblies 10 explained above. The assembly 10 comprises a combination region 26 which forms a combination layer, for example, and the carrier material layer 24. The combination region 26 has a phosphor concentration and a heat-conducting particle concentration both of which are higher than the phosphor concentration and the heat-conducting particle concentration outside the combination region 26. In other words, the phosphor particles and the heat-conducting particles in the carrier material form the combination layer 26.

The combination region 26 can be formed, for example, by the method explained above, in particular the sedimentation method. In this case, the process parameters are predefined such that the phosphor particles and the heat-conducting particles sediment equally in the carrier material and jointly form the combination layer. In particular, the process parameters are predefined such that the phosphors and the heat-conducting particles sediment in the carrier material at the same rate and/or to the same extent.

By way of example, the carrier material region 24 as viewed from the component behind the phosphor region 20, the heat-conducting particle region 20 and/or the combination region 26 can have a small proportion of phosphor particles, but the proportion is greater than the proportion of heat-conducting particles in the same region.

The phosphor concentration of the phosphor in the potting material 18 near the electromagnetic radiation emitting component 14, for example, in the combination region 26 is greater than in the potting material 18 remote from the electromagnetic radiation emitting component 14, for example, in the carrier material region 24.

The particle concentration of the heat-conducting particles in the potting material 18 near the electromagnetic radiation emitting component 14, for example, in the combination region 26 is greater than in the potting material 18 remote from the electromagnetic radiation emitting component 14, for example, in the carrier material region 24.

The phosphor concentration in the potting material 18 remote from the electromagnetic radiation emitting component 14, for example, in the carrier material region 24 can be greater than the particle concentration of the heat-conducting particles in the potting material 18 remote from the electromagnetic radiation emitting component 14, for example, in the carrier material region 24.

Figure 5:
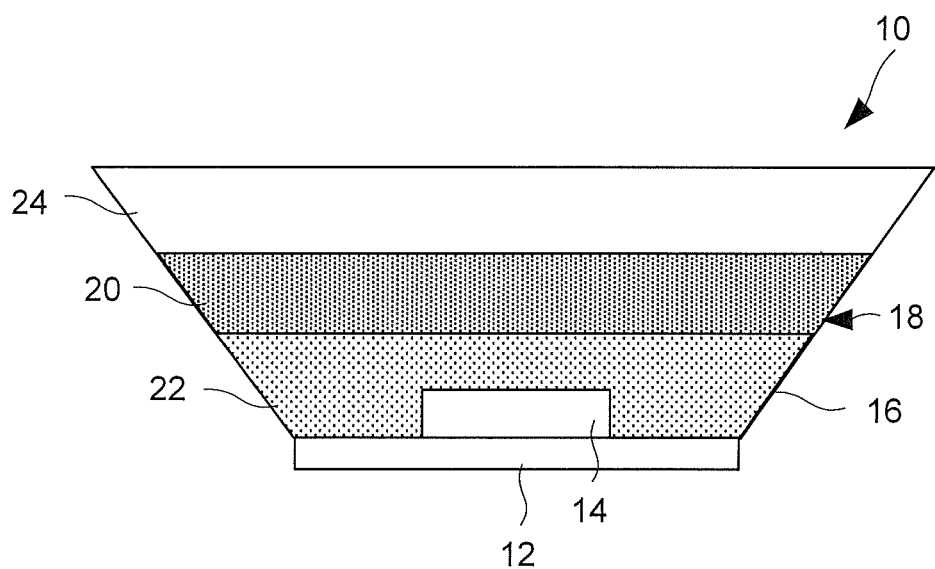
FIG. 5 shows one example of an electromagnetic radiation emitting assembly.

FIG. 5 shows one example of an assembly 10 which, for example, can largely correspond to one of the assemblies 10 explained above. The assembly 10 comprises the phosphor region 20, the heat-conducting particle region 22 and the carrier material region 24. The heat-conducting particle region 22 is formed near the component 14, for example, in a manner directly adjoining the component 14. By way of example, the component 14 is embedded into the heat-conducting particle layer. As viewed from the component 14, the phosphor region 20 is formed behind the phosphor region 20, for example, in a manner directly adjoining the heat-conducting particle region 22. As viewed from the component 14, the carrier material region 24 is formed behind the phosphor region 20, for example, in a manner directly adjoining the phosphor region 20.

The phosphor region 20, the heat-conducting particle region 22 and the carrier material region 24 can be formed, for example, by the method explained above, in particular the sedimentation method. In this case, the process parameters can be predefined such that the phosphor particles and the heat-conducting particles sediment in the carrier material and form the phosphor layer and the heat-conducting particle layer, respectively. In particular, the process parameters are predefined such that the heat-conducting particles sediment first, the most rapidly and/or to the greatest extent and in particular before the phosphors and/or more rapidly and/or to a greater extent than the phosphors. Moreover, the process parameters are predefined such that the phosphors also sediment in the carrier material.

The phosphor concentration in the potting material 18 near the electromagnetic radiation emitting component 14, for example, in the heat-conducting particle region 22, is less than the particle concentration of the heat-conducting particles in the potting material 18 near the electromagnetic radiation emitting component 14, for example, in the heat-conducting particle region 22.

The phosphor concentration in the potting material 18 remote from the electromagnetic radiation emitting component 14, for example, in the carrier material region 24, can be greater than the particle concentration of the heat-conducting particles in the potting material 18 remote from the electromagnetic radiation emitting component 14, for example, in the carrier material region 24.

Figure 6:
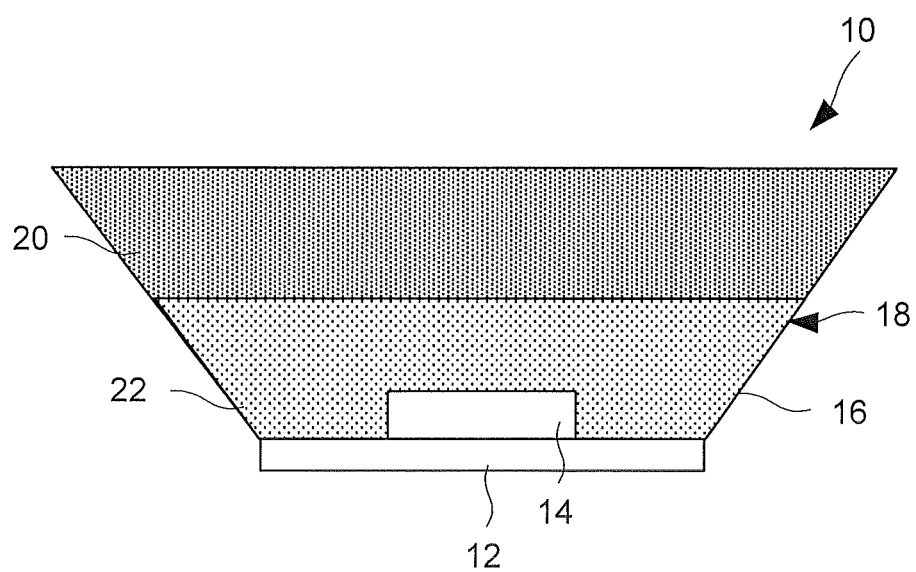
FIG. 6 shows one example of an electromagnetic radiation emitting assembly.

FIG. 6 shows one example of an assembly 10 which, for example, can largely correspond to one of the assemblies 10 explained above. The assembly 10 comprises the phosphor region 20 and the heat-conducting particle region 22, but no carrier material region 24.

The phosphor region 20 and the heat-conducting particle region 22 can be formed, for example, by the method explained above, in particular the sedimentation method. In this case, the process parameters are predefined such that, for example, only the heat-conducting particles sediment in the carrier material and form the heat-conducting particle layer. In the rest of the carrier material, the relative phosphor concentration increases as a result, whereby the phosphor layer is formed. In particular, the process parameters can be predefined such that the heat-conducting particles sediment and the phosphor particles do not sediment.

The phosphor concentration in the potting material 18 near the electromagnetic radiation emitting component 14, for example, in the heat-conducting particle region 22, is less than the particle concentration of the heat-conducting particles in the potting material 18 near the electromagnetic radiation emitting component 14, for example, in the heat-conducting particle region 22.

The phosphor concentration in the potting material 18 remote from the electromagnetic radiation emitting component 14, for example, in the phosphor region 20 is greater than the particle concentration of the heat-conducting particles in the potting material 18 remote from the electromagnetic radiation emitting component 14, for example, in the phosphor region 20.

Our methods and assemblies are not restricted to the examples specified. By way of example, the component 10 can comprise more or fewer layers. Alternatively or additionally, the component 10 can comprise two, three or more different phosphors and/or heat-conducting particles. If appropriate, the different phosphors and/or heat-conducting particles can be arranged in identical or correspondingly different layers. Furthermore, the individual layers can be produced in a different method. By way of example, a plurality of dispensing methods can be carried out successively to produce the layers. Furthermore, two or more components 10 can be arranged in a housing 16 and/or on a carrier 12 and/or be embedded into the potting material 18.

The invention claimed is:

1. An electromagnetic radiation emitting assembly comprising:
   a carrier,
   an electromagnetic radiation emitting component arranged above the carrier, and
   a potting material at least partly surrounding the electromagnetic radiation emitting component and into which are embedded phosphor that converts the electromagnetic radiation and heat-conducting particles that conduct heat arising during operation of the electromagnetic radiation emitting assembly,
   wherein a phosphor concentration in the potting material near the electromagnetic radiation emitting component is greater than a particle concentration of the heat-conducting particles in the potting material near the electromagnetic radiation emitting component, and a particle concentration of the heat-conducting particles in the potting material near the electromagnetic radiation emitting component is greater than in the potting material remote from the electromagnetic radiation emitting component.

2. The electromagnetic radiation emitting assembly as claimed in claim 1, wherein a phosphor concentration of the phosphor in the potting material near the electromagnetic radiation emitting component is greater than in the potting material remote from the electromagnetic radiation emitting component.

3. The electromagnetic radiation emitting assembly as claimed in claim 1, wherein the heat-conducting particles have a thermal conductivity of 1 W/mK to 9 W/mK.

4. The electromagnetic radiation emitting assembly as claimed in claim 1, wherein the heat-conducting particles comprise $SiO_2$ and/or cristobalite.

5. An electromagnetic radiation emitting assembly comprising:
 a carrier,
 an electromagnetic radiation emitting component arranged above the carrier, and
 a potting material at least partly surrounding the electromagnetic radiation emitting component and into which are embedded phosphor that converts the electromagnetic radiation and heat-conducting particles that conduct heat arising during operation of the electromagnetic radiation emitting assembly,
 wherein a phosphor concentration in the potting material near the electromagnetic radiation emitting component is greater than a particle concentration of the heat-conducting particles in the potting material near the electromagnetic radiation emitting component, and the phosphor concentration in the potting material remote from the electromagnetic radiation emitting component is greater than the particle concentration of the heat-conducting particles in the potting material remote from the electromagnetic radiation emitting component.

6. The electromagnetic radiation emitting assembly as claimed in claim 5, wherein a phosphor concentration of the phosphor in the potting material near the electromagnetic radiation emitting component is greater than in the potting material remote from the electromagnetic radiation emitting component.

7. The electromagnetic radiation emitting assembly as claimed in claim 5, wherein the heat-conducting particles have a thermal conductivity of 1 W/mK to 9 W/mK.

8. The electromagnetic radiation emitting assembly as claimed in claim 5, wherein the heat-conducting particles comprise $SiO_2$ and/or cristobalite.

9. A method of producing an electromagnetic radiation emitting assembly, comprising:
 arranging an electromagnetic radiation emitting component above a carrier, and
 arranging a potting material above the electromagnetic radiation emitting component such that the potting material at least partly surrounds the electromagnetic radiation emitting component,
 wherein phosphor that converts the electromagnetic radiation and heat-conducting particles that conduct heat arising during operation of the electromagnetic radiation emitting assembly are embedded in the potting material, the potting material, the phosphor particles and the heat-conducting particles are formed, and process parameters are predefined such that the phosphor particles and the heat-conducting particles sediment in the potting material and the phosphor concentration in the potting material near the electromagnetic radiation emitting component becomes greater than the particle concentration of the heat-conducting particles in the potting material near the electromagnetic radiation emitting component and a particle concentration of the heat-conducting particles in the potting material near the electromagnetic radiation emitting component becomes greater than in the potting material remote from the electromagnetic radiation emitting component.

10. The method as claimed in claim 9, wherein the potting material and the phosphor particles are formed, and process parameters are predefined such that the phosphors sediment in the potting material such that a phosphor concentration of the phosphor in the potting material near the electromagnetic radiation emitting component becomes greater than in the potting material remote from the electromagnetic radiation emitting component.

11. The method as claimed in claim 9, wherein particles having a thermal conductivity of 1 W/mK to 9 W/mK are used as heat-conducting particles.

12. A method of producing an electromagnetic radiation emitting assembly, comprising:
 arranging an electromagnetic radiation emitting component above a carrier, and
 arranging a potting material above the electromagnetic radiation emitting component such that the potting material at least partly surrounds the electromagnetic radiation emitting component,
 wherein phosphor that converts the electromagnetic radiation and heat-conducting particles that conduct heat arising during operation of the electromagnetic radiation emitting assembly are embedded in the potting material, the potting material, the phosphor particles and the heat-conducting particles are formed, and process parameters are predefined such that the phosphor particles and the heat-conducting particles sediment in the potting material and the phosphor concentration in the potting material near the electromagnetic radiation emitting component becomes greater than the particle concentration of the heat-conducting particles in the potting material near the electromagnetic radiation emitting component and the phosphor concentration in the potting material remote from the electromagnetic radiation emitting component becomes greater than the particle concentration of the heat-conducting particles in the potting material remote from the electromagnetic radiation emitting component.

13. The method as claimed in claim 12, wherein the potting material and the phosphor particles are formed, and process parameters are predefined such that the phosphors sediment in the potting material such that a phosphor concentration of the phosphor in the potting material near the electromagnetic radiation emitting component becomes greater than in the potting material remote from the electromagnetic radiation emitting component.

14. The method as claimed in claim 12, wherein particles having a thermal conductivity of 1 W/mK to 9 W/mK are used as heat-conducting particles.

* * * * *